United States Patent
Hunt et al.

(10) Patent No.: US 7,452,818 B2
(45) Date of Patent: Nov. 18, 2008

(54) METHOD FOR SELECTIVELY ETCHING PORTIONS OF A LAYER OF MATERIAL BASED UPON A DENSITY OR SIZE OF SEMICONDUCTOR FEATURES LOCATED THEREUNDER

(75) Inventors: Kyle Hunt, Richardson, TX (US); Neel Bhatt, Allen, TX (US); Asadd M. Hosein, Plano, TX (US); Brian L. Vialpando, Dallas, TX (US); William R. Morrison, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/694,700

(22) Filed: Mar. 30, 2007

(65) Prior Publication Data
US 2008/0242007 A1    Oct. 2, 2008

(51) Int. Cl.
*H01L 21/302*    (2006.01)
*H01L 21/461*    (2006.01)

(52) U.S. Cl. ............... 438/692; 438/680; 257/E21.17; 257/E21.304; 257/E21.632

(58) Field of Classification Search ............... 438/692, 438/680, 618, 733, 734, 197, 199
See application file for complete search history.

(56) References Cited

U.S. PATENT DOCUMENTS

| | | | | |
|---|---|---|---|---|
| 5,953,612 | A * | 9/1999 | Lin et al. | 438/299 |
| 6,074,921 | A * | 6/2000 | Lin | 438/299 |
| 6,143,613 | A * | 11/2000 | Lin | 438/299 |
| 6,420,273 | B1 * | 7/2002 | Lin | 438/706 |

* cited by examiner

*Primary Examiner*—David Nhu
(74) *Attorney, Agent, or Firm*—Wade J. Brady, III; Frederick J. Telecky, Jr.

(57) ABSTRACT

The disclosure provides a method for manufacturing a semiconductor device. The method, in one embodiment, includes forming semiconductor features (405, 410, 415, 420, 425, 430, 435, 440, 445) over a substrate (310), and then forming a layer of material (510) over the semiconductor features (405, 410, 415, 420, 425, 430, 435, 440, 445). This method further includes selectively etching portions of the layer of material (510) based upon a density or size of the semiconductor features (405, 410, 415, 420, 425, 430, 435, 440, 445) located thereunder, and then polishing remaining portions of the layer of material (510).

17 Claims, 9 Drawing Sheets

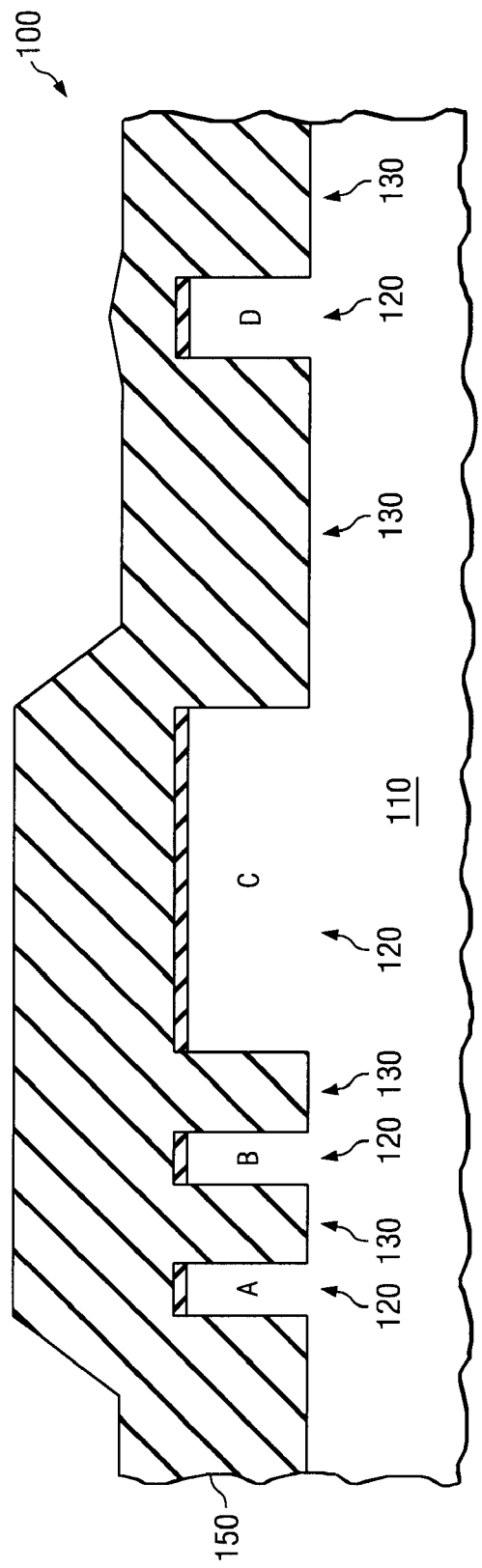
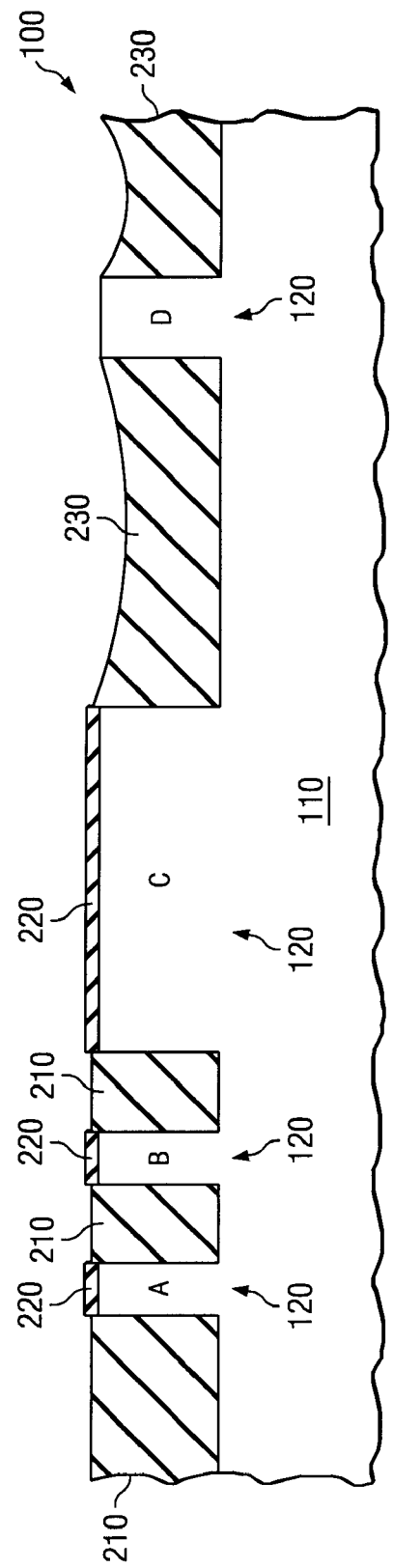
FIG. 1 (PRIOR ART)
FIG. 2 (PRIOR ART)

US 7,452,818 B2

METHOD FOR SELECTIVELY ETCHING PORTIONS OF A LAYER OF MATERIAL BASED UPON A DENSITY OR SIZE OF SEMICONDUCTOR FEATURES LOCATED THEREUNDER

TECHNICAL FIELD OF THE INVENTION

The invention is directed, in general, to a method for manufacturing a semiconductor device and, more specifically, to a method for selectively etching portions of a layer of material based upon a density or size of semiconductor features located thereunder.

BACKGROUND OF THE INVENTION

Chemical-mechanical polishing (CMP) is a modern technique for planarizing a layer of material. In certain circumstances, CMP is used to planarize a layer of isolation material that is grown or deposited between active areas of a semiconductor substrate. The term "active area" is commonly used to describe that portion of the semiconductor substrate on which components are built, such as transistors, capacitors and resistors. As is well known in the art, in order to prevent conduction or crosstalk between active areas on a substrate, an electrical isolation material (e.g., silicon dioxide), referred to herein as an isolation material, is placed between the active regions. This may be accomplished by etching trenches into the substrate between the active areas, and thereafter filling the trenches with the isolation material. What typically results are isolation structures between the active areas.

FIG. 1 illustrates a semiconductor device 100 at a stage after which a layer of isolation material 150 has been deposited over a substrate 110. The substrate 110 of FIG. 1 includes active areas of silicon 120 (e.g., areas A, B, C, D) separated by trenches 130. In the device 100, the trenches 130 between active areas A, B and C are much narrower than the trench 130 between active areas C and D.

As is illustrated in FIG. 1, the layer of isolation material 150 often does not have a flat topography, but has significant protrusions above the active areas A, B, C. However, where there are no active areas, such as between active areas C and D, or alternatively when an active area is isolated from the other densely populated features, such as over active area D, the layer of isolation material 150 is relatively flat. As is well known in the art, it is desirable that the layer of isolation material ultimately be flat, even if the aforementioned active areas cause it to have topography. Accordingly, layers of isolation material having topography are typically subjected to a CMP operation.

FIG. 2 illustrates the device 100 of FIG. 1 after subjecting it to a CMP operation. The CMP operation stops when it reaches the stop layer 220, thus leaving the layer of isolation material 210 slightly below the top of the stop layer 220. This can be seen in the areas between active areas A and B and active areas B and C. Unfortunately, where there is a significant distance between active areas, such as between active areas C and D, the layer of isolation material 210 may be overpolished. When the overpolishing occurs, significant dishing 230 may result, and thus a non-planarized surface may result. Moreover, the overpolishing may completely remove the stop layer 220 in those circumstances that it exists, thus affecting the top surface of the active area D. In extreme circumstances, a significant portion of the top surface of the active area D may be polished away. The overpolishing will impair device performance, reliability and yield. It is believed that the overpolishing for active area D is caused by the unevenness in pressure that is applied because of the difference in the area density between the area encompassing active areas A, B, and C and the area which only has active area D, as well as the process selectivity, e.g. physical or chemical selectivity, that may be a result of differences in pre-polish topography.

Accordingly, what is needed in the art is a method for manufacturing a semiconductor device that addresses the aforementioned CMP issues.

SUMMARY OF THE INVENTION

To address the above-discussed deficiencies of the prior art, the disclosure provides a method for manufacturing a semiconductor device. The method, in this embodiment, includes forming semiconductor features over a substrate, and then forming a layer of material over the semiconductor features. This method further includes selectively etching portions of the layer of material based upon a density or size of the semiconductor features located thereunder, and then polishing remaining portions of the layer of material.

Also provided is an alternative method for manufacturing a semiconductor device. This alternative method, without limitation, may include: (1) forming active device regions within a substrate using a first patterned masking layer, the active device regions separated from one another with trenches, (2) forming a layer of dielectric material over the active device regions and within the trenches, (3) selectively etching portions of the layer of dielectric material based upon a density or size of the active device regions or the trenches and using a second patterned masking layer, wherein the second patterned masking layer is not a substantially reverse pattern of the first patterned masking layer, (4) polishing remaining portions of the layer of dielectric material after selectively etching, and (5) forming gate structures over one or more of the active device regions, wherein the gate structures each include a gate dielectric and gate electrode.

BRIEF DESCRIPTION OF THE DRAWINGS

For a more complete understanding of the invention, reference is now made to the following descriptions taken in conjunction with the accompanying drawings, in which:

FIGS. 1-2 illustrate a conventional semiconductor device process;

DETAILED DESCRIPTION

Figure 3:
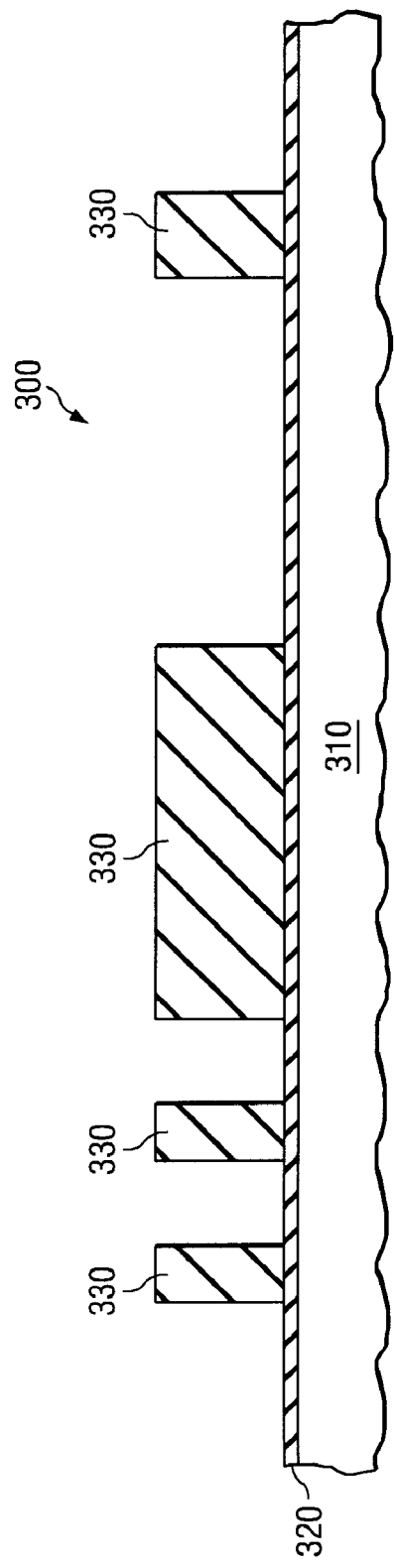
FIGS. 3-8 illustrate one embodiment for forming a semiconductor device in accordance with this disclosure.

The present disclosure is based, at least in part, on the acknowledgement that it is difficult to obtain surface uniformity using conventional polishing operations (e.g., a chemical mechanical polishing (CMP) operation). For instance, the present disclosure recognizes that conventional methods are often incapable of providing the desired surface uniformity, particularly as semiconductor feature sizes continue to decrease and varying feature densities continue to increase. Accordingly, the present inventors acknowledge that a different process for obtaining surface uniformity is needed.

The present disclosure has further acknowledged that the conventional process of using a reverse mask to remove portions of a material layer prior to the polishing of that layer, is no longer sufficient. As those skilled in the art appreciate, one common process for improving surface uniformity consists of using a reverse mask to remove portions of a material layer prior to the polishing of that layer. The reverse mask, in most instances, is a substantial reverse image of the mask used to form the patterned features located therebelow. In certain instances, a same reticle is used to form the reverse mask as is used to form the mask for the patterned features. However, in this scenario an opposite type resist material is used to pattern the different masks. In any instance, however, portions of the material layer directly above the patterned features would be removed using the reverse mask. Unfortunately, as the semiconductor features continue to decrease in size, the ability to accurately align the reverse mask prevents its continued use. For example, when the required photolithography process margin is greater than the minimum feature size, both the capability to print the small features and properly align them from level to level decreases.

After acknowledging the limitations of the reverse mask process, the present inventors recognized that rather than using a reverse mask, as described above, portions of the material layer could be removed based upon a density or size of the semiconductor features located therebelow. For example, openings in the material layer could be selectively etched as a function of the density or size of the semiconductor features located therebelow, as opposed to being etched as a function the reverse mask image. The terms "selectively etched" or "selectively etching", as used herein, mean that the material layer is being etched using criteria other than the aforementioned reverse mask process, and moreover that less than an entire portion of the material layer is being etched. For example, openings in the material layer could be selectively etched above very dense areas, or alternatively very large features, whereas the material layer over less dense areas or smaller features would have no openings etched therein. In contrast, the reverse mask process described above etches the material layer based strictly upon it being a reverse image of the patterned features located therebelow, and not based upon the density or size. Additionally, the reverse mask process would include opening above all patterned features, as opposed to only those areas selected as a function of the density or size of the features.

FIGS. 3-8 illustrate one embodiment for forming a semiconductor device in accordance with this disclosure. While FIGS. 3-8 illustrate that the semiconductor features are active regions having trenches located therebetween, the inventive aspects of the present disclosure are equally applicable to other semiconductor features located within a semiconductor device. For instance, the inventive aspects of the disclosure could be applied to conductive features (e.g., conductive runners or traces) having spaces therebetween. Basically, any line/space pattern that will ultimately have a material layer formed thereover, might benefit from the present disclosure.

FIG. 3 illustrates a semiconductor device 300 at an initial stage of manufacture. The device 300 includes a substrate 310. The substrate 310 may, in one embodiment, be any layer located in the device 300, including a wafer itself or a layer located above the wafer (e.g., epitaxial layer). In the embodiment illustrated in FIG. 3, the substrate 310 is a p-type substrate; however, one skilled in the art understands that the substrate 310 could be an n-type substrate without departing from the disclosure.

Located over the substrate 310 is an isolation layer 320. As used herein "isolation layer" refers to a layer which provides electrical and/or physical isolation. The isolation layer 320 may comprise one or more layers. For example, in one embodiment the isolation layer 320 only includes a first pad oxide (buffer oxide) of silicon dioxide. In this embodiment, the first pad oxide may have a thickness ranging from about 10 nm to about 30 nm, and may be thermally grown on the substrate 310. However, other embodiments exist wherein more than one layer is used.

Located over the substrate 310 is a first patterned masking layer 330. The first patterned masking layer 330 will subsequently be used to etch semiconductor features within the substrate 310. Accordingly, the first patterned masking layer 330 exposes certain portions of the device 300 and protects other portions of the device 300.

The first patterned masking layer 330 may comprise a variety of different masking materials and remain within the purview of the disclosure. In one embodiment, the first patterned masking layer 330 comprises a silicon nitride layer that was previously patterned using a lithography process (e.g., resist and a reticle). In this embodiment, the silicon nitride layer may be formed on top of the isolation layer 320 by chemical vapor deposition (CVD) or another suitable process, and may have a thickness ranging from about 100 nm to about 200 nm. Thereafter, a conventional lithography and etch process could be used to correct the conformal silicon nitride layer into the patterned masking layer 330. In an alternative embodiment, the patterned masking layer 330 comprises patterned resist. In this embodiment, a conformal layer of resist might be deposited on the isolation layer 320. Thereafter, a conventional lithography process might be used to transfer a pattern from a reticle to the resist.

Figure 4:
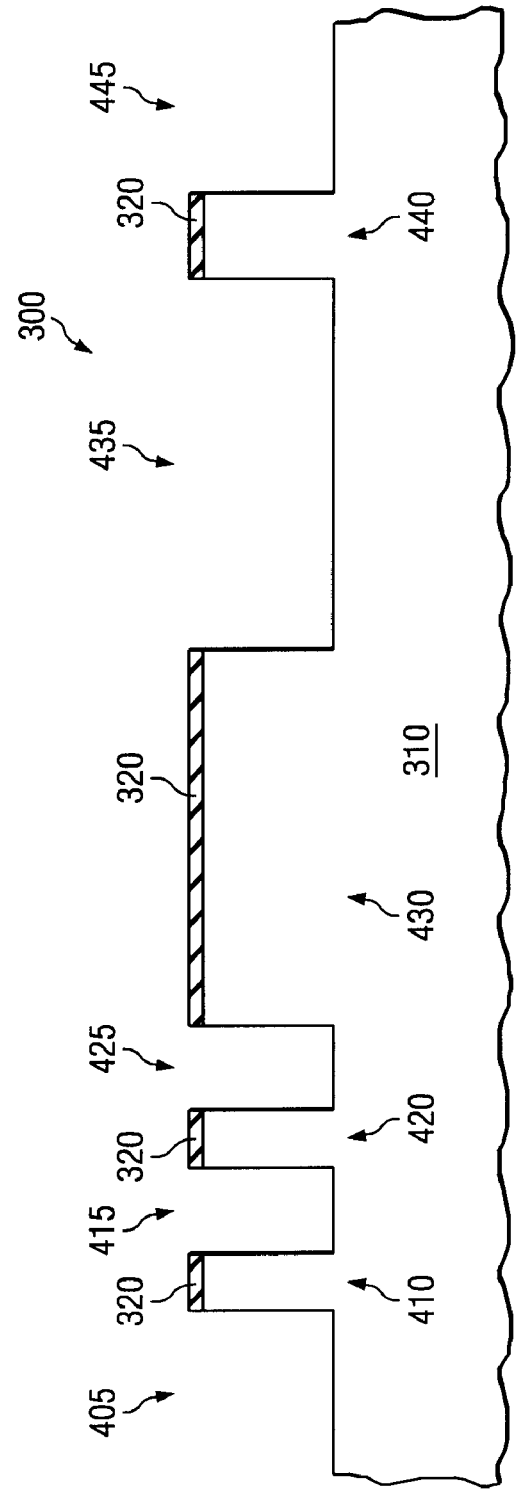

FIG. 4 illustrates the device 300 of FIG. 3 after using the masking layer 330 to etch into the substrate 310 and thereby form semiconductor features. In the embodiment of FIG. 3, the masking layer 330 assists in the forming of active device regions 410, 420, 430, 440 (e.g., semiconductor features). In this embodiment, the active device regions 410, 420, 430, 440 are bounded by trenches 405, 415, 425, 435, 445, respectively. The term "active device region" as used throughout this disclosure means a region of the device 300 that will ultimately include active type features. For example, the active device regions may ultimately include transistor devices, such as transistors used to form CMOS devices, BiCMOS devices, Bipolar devices. The active device regions may also ultimately include capacitors, inductors or resistors, or may also include optical devices or optoelectronic devices, among others. The active device regions do not, however, include isolation structures, such as trench isolation structures. Any suitable etch may be used to etch the substrate 310.

Figure 5:
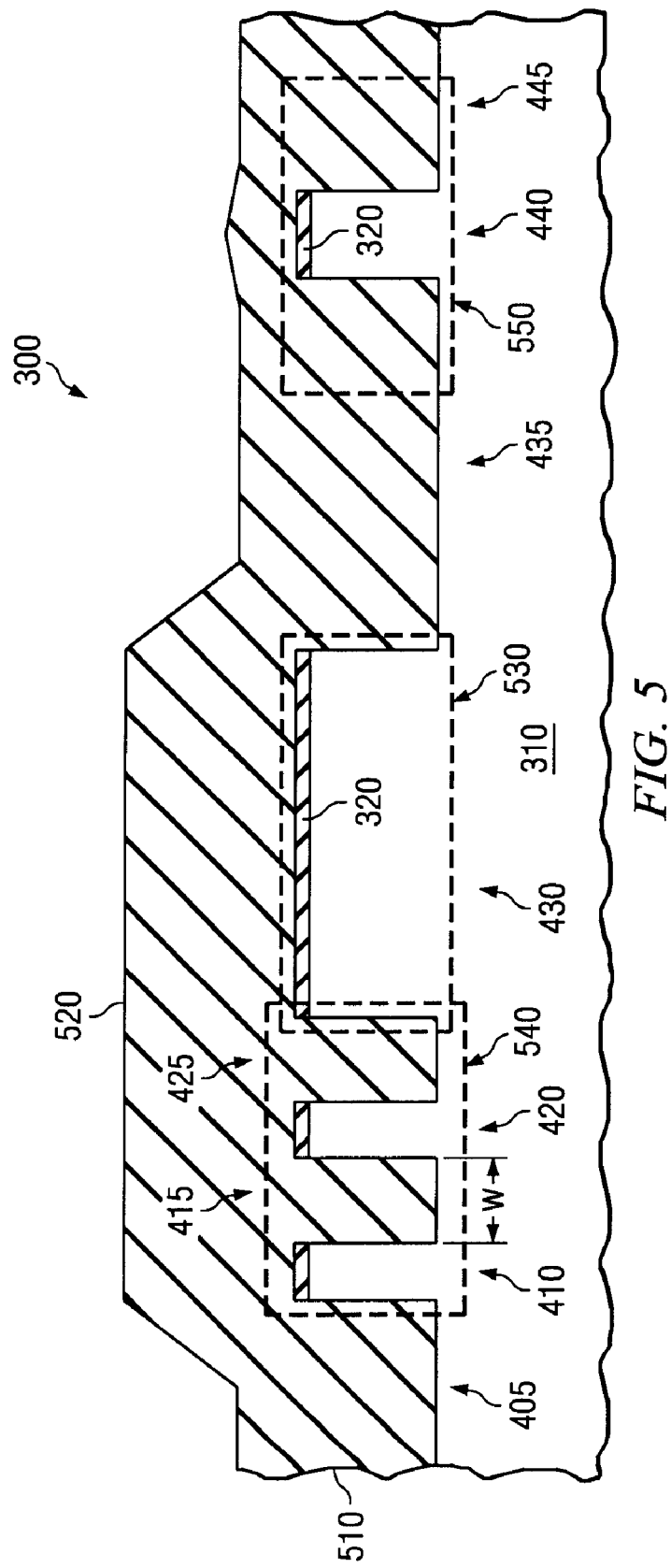

FIG. 5 illustrates the device 300 of FIG. 4 after forming a layer of material 510 over the active device regions 410, 420, 430, 440. The layer of material 510, in the embodiment shown, also fills the trenches 405, 415, 425, 435, 445. The layer of material 510, in one embodiment, comprises a dielectric material. For example, the layer of material 510 can comprise silicon dioxide, as is well known in the art; however, HDP, densified SACVD, TEOS and HSQ films, among others, can also be used. HDP and densified TEOS show low variation across the substrate, which helps with the problems discussed herein.

The layer of material 510 may be formed using any suitable manufacturing process. For example, in one embodiment the layer of material 510 is CVD deposited to a thickness ranging from about 500 nm to about 2000 nm. Other formation techniques and thicknesses could also be used.

As is illustrated in FIG. 5, densely populated areas of the semiconductor features, or alternatively very large semiconductor features, may cause the layer of material 510 to have an anomaly 520. For example, in one embodiment, features having a surface area of at least about 10 μm×10 μm may create an anomaly 520. Region 530 includes the active device region 430, which has a surface area of greater than this size. As is illustrated, the active device region 430 helps cause the anomaly 520. Alternatively, 10 μm×10 μm areas of features having trenches (e.g., openings or spaces) with only widths (w) of 0.8 μm or less may also create an anomaly 520. Region 540 represents such a densely populated area with only widths (w) of 0.8 μm or less. As is illustrated, the active device regions 410, 420, 430 and associated trenches 415, 425 help cause the anomaly 520. In contrast, less densely populated areas of the substrate 310, or alternatively areas having smaller features, do not cause such an anomaly. For example, region 550 includes the active device region 440 and the trenches 435, 445, which are insufficient to cause an anomaly.

Figure 6A:
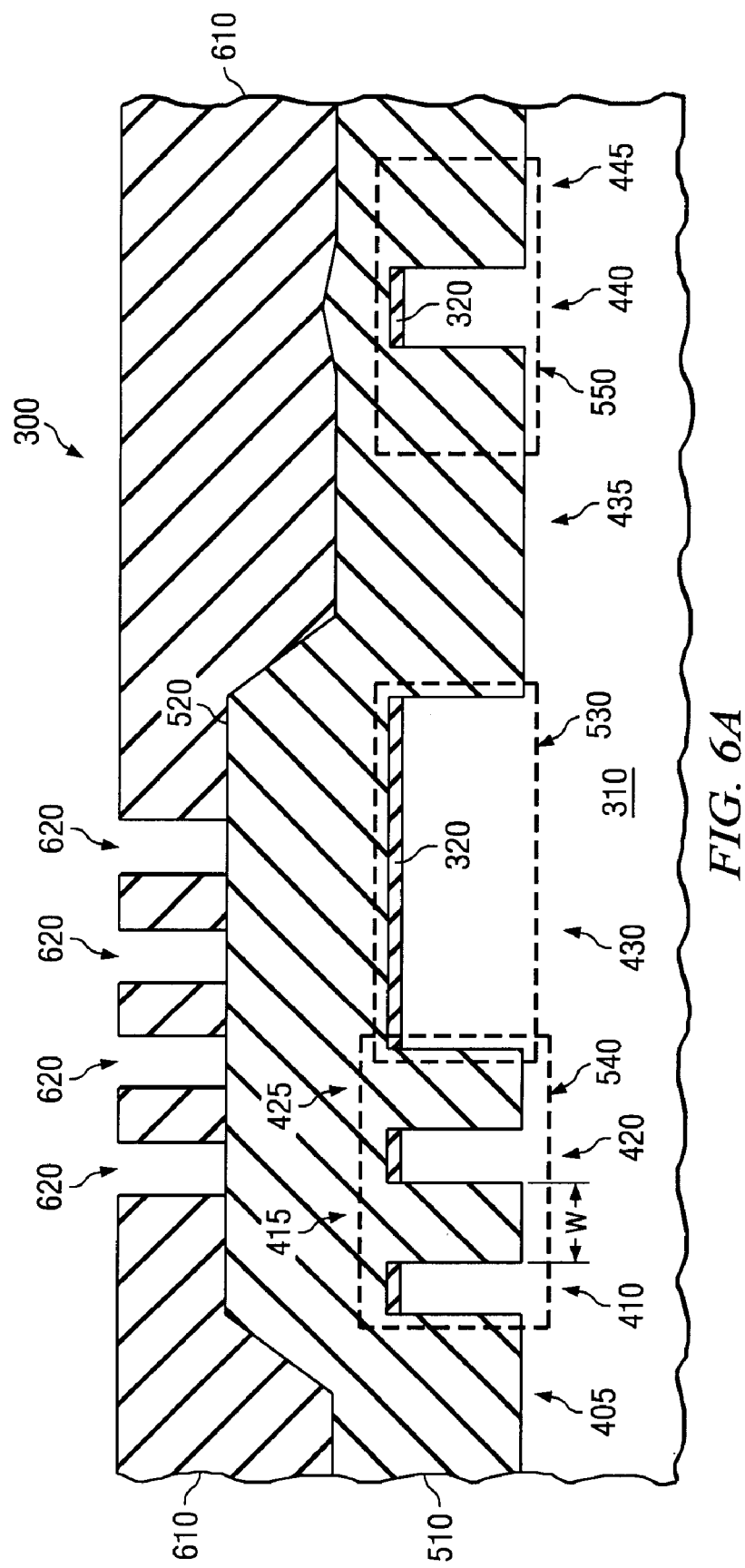
Figure 6B:
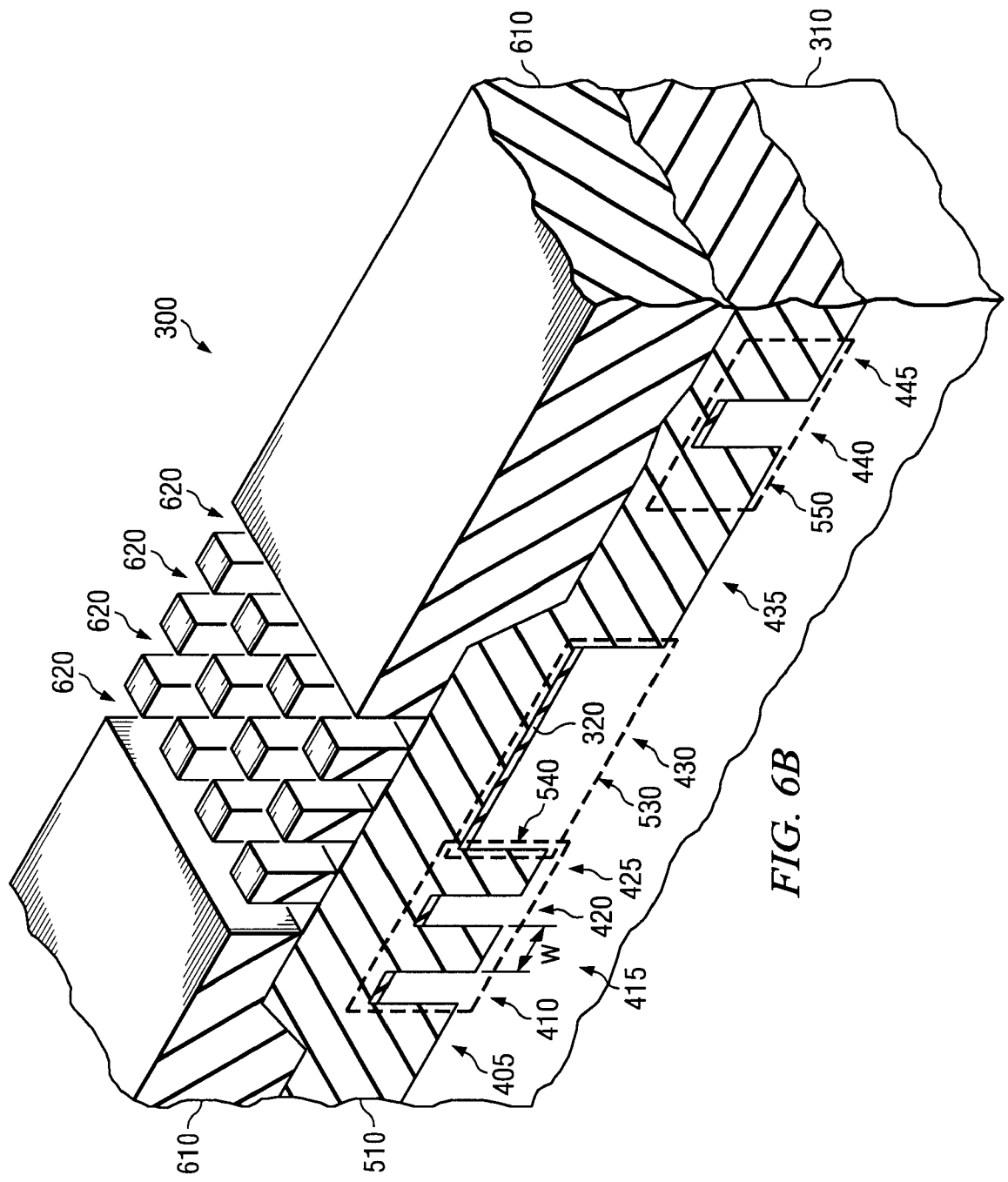

FIGS. 6A and 6B illustrate the device 300 of FIG. 5 after forming a second patterned masking layer 610 over the layer of material 510. The second patterned masking layer 610 includes two or more openings 620 therein, and should typically not be a substantially reverse pattern of the first patterned masking layer 330. In accordance with this disclosure, the location of the two or more openings 620 in the second patterned masking layer 610 is based upon the density or size of the semiconductor features (e.g., active device regions 410, 420, 430, 440 in this embodiment). For example, in the illustrated embodiment the two or more openings 620 are located above regions 530, 540, and not above region 550. Accordingly, in this embodiment the two or more openings 620 are located above densely populated areas of the semiconductor features, or alternatively very large semiconductor features. In this embodiment, however, the two or more openings 620 are not located sparsely populated areas of the semiconductor features or relatively small semiconductor features, such as might be found in region 550.

In an alternative embodiment, the two or more openings might be located above region 550 and not above regions 530, 540. In this embodiment, as opposed to helping with substrate uniformity, the two or more openings might be used to create additional dishing in the region 550. In an even alternative embodiment, the two or more openings 620 would be located over the region 530 and not the regions 540, 550. Other combinations could also exist. Nevertheless, it is unlikely, if not impractical, that the two or more openings 620 would be located over all regions of a substrate 310. This scenario would likely represent the use of the aforementioned reverse mask, which is outside the scope of this disclosure.

The two or more openings 620 may vary in number, size, shape and pitch and remain within the scope of the disclosure. For example, in one embodiment, the two or more openings 620 are square in nature, have dimensions of about 3.5 μm×3.5 μm, and are on a pitch of about 5 μm×5 μm. In an alternative embodiment, the two or more openings 620 are round in nature, have a diameter of about 3.5 μm, and are on a pitch of about 5 μm×5 μm. Nevertheless, these represent just a few embodiments consistent with this disclosure, and thus other embodiments are sure to exist.

The second patterned masking layer 610 may be formed using a variety of processes, conventional and not. In one embodiment, a conformal layer of masking material is deposited over the substrate 310. The conformal layer of masking material may comprise similar materials as the first patterned masking layer 330. Thereafter, the conformal layer of masking material may be patterned using a reticle. The reticle, in this embodiment, would have its own pattern that is based upon the density or size of the semiconductor features of the device 300. What results is the second patterned masking layer 610 having two or more openings 620 therein that are based upon the aforementioned density or size.

Figure 7A:
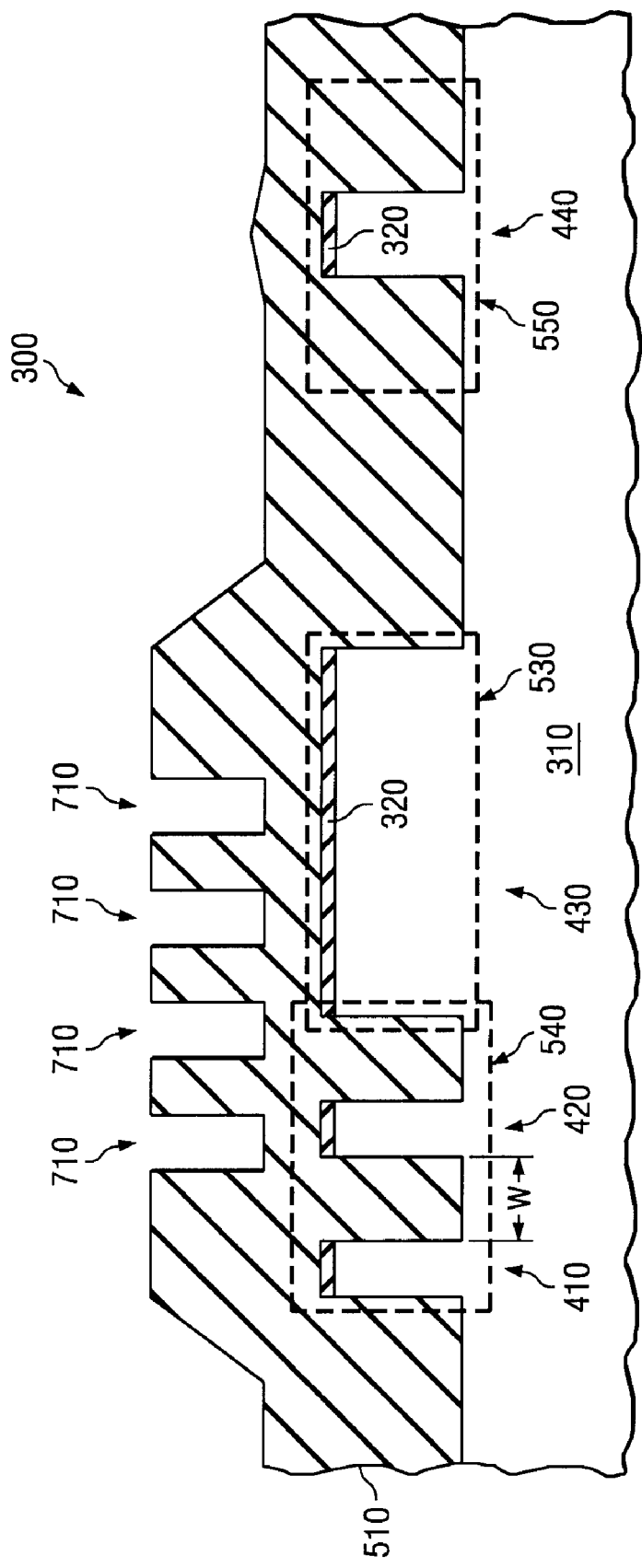
Figure 7B:
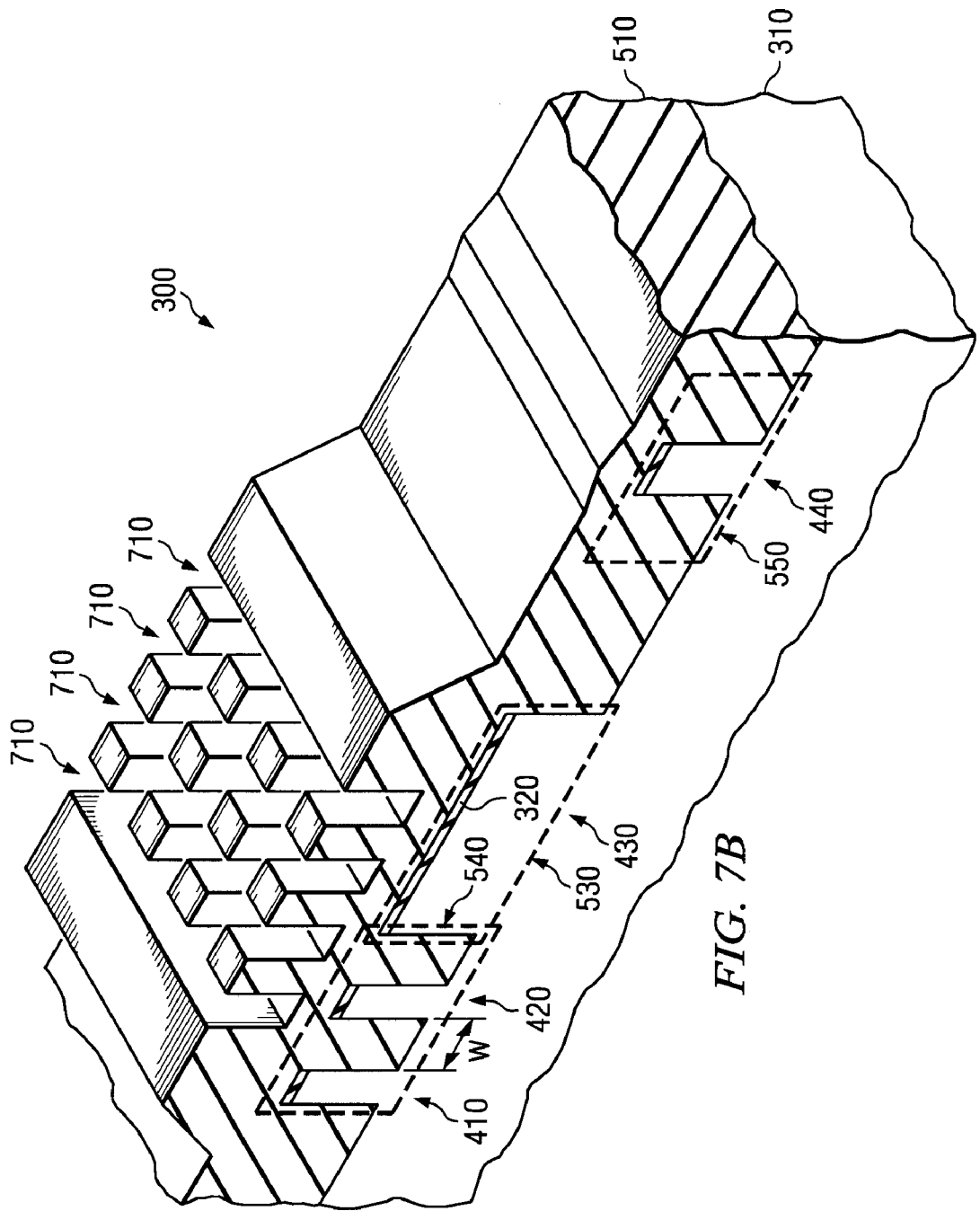

FIGS. 7A and 7B illustrate the device 300 of FIGS. 6A and 6B after selectively etching the layer of material 510 using the two or more openings 620, and thus based upon the density or size of the semiconductor features located thereunder. The etch causes two or more openings 710 to be formed within the layer of material 510, and moreover in the appropriate location based upon the density or size of the semiconductor features (e.g., above the region 530 and region 540 in this embodiment). In the illustrative embodiment, the two or more openings 710 extend only partially into the layer of material 510. Accordingly, the two or more openings 710 do not extend to the isolation layer 320. Other embodiments, however, exist wherein the two or more openings 710 do extend to the isolation layer 320. The depth of the two or more openings 710 into the layer of material 510 is based upon many different criteria, one of which includes the ultimate step height of the active device regions 410, 420, 430, 440.

Any suitable etch may be used to form the two or more openings 710 within the layer of material 510. Nevertheless, in one embodiment an anisotropic plasma dry etch is used. However, alternative embodiments exist wherein different etch conditions are used, including, but not limited to isotropic plasma etches or wet-process etch chemistries.

Figure 8:
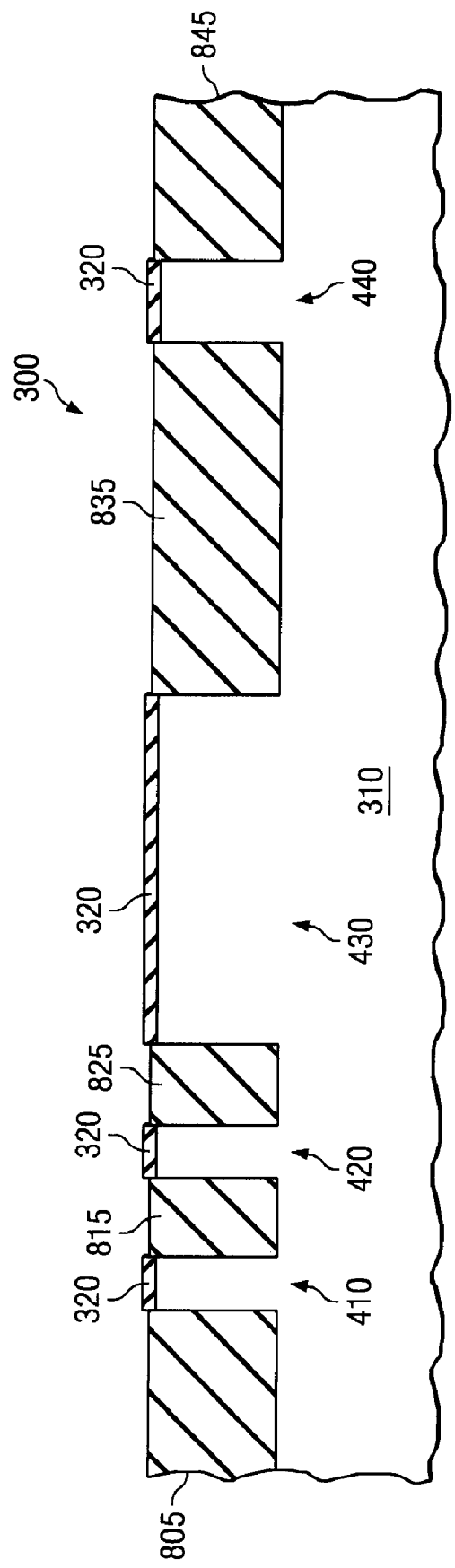

FIG. 8 illustrates the device 300 of FIGS. 7A and 7B after polishing the portions of the layer of material 510 remaining after forming the two or more openings 710 therein. For example, the surface of the layer of material 510 may be planarized using CMP in order to remove the layer of material 510 above active device areas 410, 420, 430, 440. In one embodiment, the CMP process proceeds until the isolation layer 320 is detected, at which time the process is halted. In the illustrated embodiment, however, the CMP process is continued until the layer of material 510 is slightly below the isolation layer 320. What results are isolation structures 805, 815, 825, 835, 845, which separate the active device areas 410, 420, 430, 440, respectively. The isolation layer 320 may thereafter be removed.

The manufacturing process described herein provides many benefits over conventional processes. First, it is able to accommodate the ever decreasing semiconductor feature sizes, as opposed to the reverse mask process, which can not. Second, it allows the CMP process to polish the die more uniformly. This allows the manufacturing process to meet step height requirements in dense areas, for example without damaging other features. Such an advantage is shown in FIG. 8 wherein the isolation layer 320 is substantially intact across the die, and for this reason none of the active device areas 410, 420, 430, 440 have been removed or negatively affected.

Figure 9:
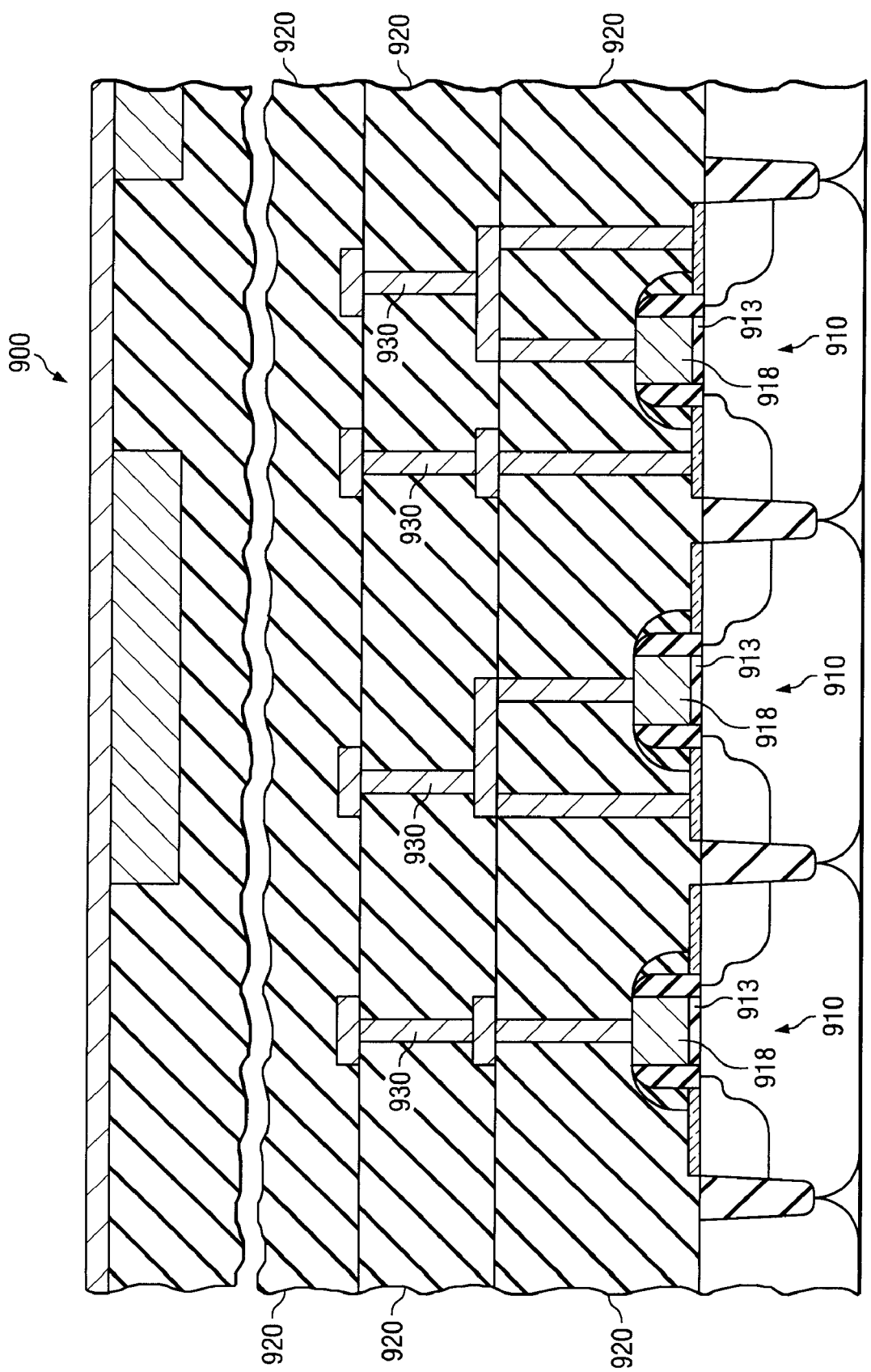
FIG. 9 illustrates an integrated circuit (IC) having been manufactured using one embodiment of the disclosure.

FIG. 9 illustrates an integrated circuit (IC) 900 having been manufactured using one embodiment of the disclosure. The IC 900 may include devices, such as transistors used to form CMOS devices, BiCMOS devices, Bipolar devices, as well as capacitors or other types of devices. The IC 900 may further include passive devices, such as inductors or resistors, or it may also include optical devices or optoelectronic devices. Those skilled in the art are familiar with these various types of devices and their manufacture. In the particular embodiment illustrated in FIG. 9, the IC 900 includes devices 910 manufactured using similar processes as described above with respect to FIGS. 3-8. The devices 910, in the embodiment shown, include gate dielectrics 913 and gate electrodes 918. Located over the devices 910 are interlevel dielectric layers 920. Located within the interlevel dielectric layers 920 and contacting the devices 910 are interconnects 930. The resulting IC 900 is optimally configured as an operational integrated circuit.

Those skilled in the art to which the invention relates will appreciate that other and further additions, deletions, substitutions and modifications may be made to the described embodiments without departing from the scope of the invention.

What is claimed is:

1. A method for manufacturing a semiconductor device, comprising:
    forming semiconductor features over a substrate using a first patterned masking layer;
    forming a layer of material over the semiconductor features;
    selectively etching portions of the layer of material based upon a density or size of the semiconductor features located thereunder and using a second patterned masking layer, wherein the second patterned masking layer is not a substantially reverse pattern of the first patterned masking layer; and
    polishing remaining portions of the layer of material after selectively etching.

2. The method of claim 1 wherein selectively etching includes:
    forming a masking layer over the layer of material;
        patterning the masking layer using a reticle, wherein openings in the masking layer are based upon the density or size of the semiconductor features; and
        etching the layer of material using the openings in the masking layer.

3. The method of claim 2 wherein forming semiconductor features includes forming active device regions in the substrate and trenches separating the active device regions from one another.

4. The method of claim 3 wherein two or more openings in the masking layer are located over active device regions having a surface area of greater than 10 μm×10 μm.

5. The method of claim 3 wherein two or more openings in the masking layer are located over each active device region having a surface area of greater than 10 μm×10 μm.

6. The method of claim 3 wherein two or more openings in the masking layer are located over 10 μm×10 μm areas of the substrate having trenches with only widths of 0.8 μm or less.

7. The method of claim 3 wherein two or more openings in the masking layer are located over each 10 μm×10 μm area of the substrate having trenches with only widths of 0.8 μm or less.

8. The method of claim 3 wherein forming a layer of material includes forming a layer of dielectric material over the active device regions and within the trenches.

9. The method of claim 2 wherein forming semiconductor features includes forming conductive features over the substrate having spaces therebetween.

10. A method for manufacturing a semiconductor device, comprising:
    forming active device regions within a substrate using a first patterned masking layer, the active device regions separated from one another with trenches;
    forming a layer of dielectric material over the active device regions and within the trenches;
    selectively etching portions of the layer of dielectric material based upon a density or size of the active device regions or the trenches and using a second patterned masking layer, wherein the second patterned masking layer is not a substantially reverse pattern of the first patterned masking layer;
    polishing remaining portions of the layer of dielectric material after selectively etching; and
    forming gate structures over one or more of the active device regions, wherein the gate structures each includes a gate dielectric and a gate electrode.

11. The method of claim 10 wherein selectively etching includes:
    forming a masking layer over the layer of dielectric material;
    patterning the masking layer to form the second patterned masking layer and using a reticle, wherein openings in the second patterned masking layer are based upon the density or size of the active device regions or the trenches; and
    etching the layer of dielectric material using the openings in the second patterned masking layer.

12. The method of claim 11 wherein two or more openings in the masking layer are located over active device regions having a surface area of greater than 10 μm×10 μm.

13. The method of claim 11 wherein two or more openings in the masking layer are located over each active device region having a surface area of greater than 10 μm×10 μm.

14. The method of claim 11 wherein two or more openings in the masking layer are located over 10 μm×10 μm areas of the substrate having trenches with only widths of 0.8 μm or less.

15. The method of claim 11 wherein two or more openings in the masking layer are located over each 10 μm×10 μm area of the substrate having trenches with only widths of 0.8 μm or less.

16. The method of claim 10 wherein polishing includes polishing using a chemical mechanical polishing (CMP) apparatus.

17. The method of claim 10 further including forming interlevel dielectric layers above the gate structures, wherein the interlevel dielectric layers have interconnects therein for contacting one or more of the gate structures.

* * * * *